United States Patent
Frosien (10) Patent No.: US 7,829,870 B2
(45) Date of Patent: Nov. 9, 2010

(54) METHOD AND APPARATUS FOR IN-SITU SAMPLE PREPARATION

(75) Inventor: Juergen Frosien, Riemerling (DE)

(73) Assignee: ICT Integrated Circuit Testing Gesellschaft für Halbleiterprüftechnik mbH, Heimstetten (DE)

( * ) Notice: Subject to any disclaimer, the term of this patent is extended or adjusted under 35 U.S.C. 154(b) by 192 days.

(21) Appl. No.: 11/925,595

(22) Filed: Oct. 26, 2007

(65) Prior Publication Data

US 2008/0185517 A1    Aug. 7, 2008

(30) Foreign Application Priority Data

Feb. 6, 2007   (EP)  ................................ 07002553

(51) Int. Cl.
*A61N 5/00*    (2006.01)
*G21G 5/00*    (2006.01)
*G21K 5/10*    (2006.01)
*H01J 37/08*    (2006.01)
*H01J 27/00*    (2006.01)

(52) U.S. Cl. .............................. 250/492.1; 250/492.21; 250/492.3; 250/423 R; 250/425

(58) Field of Classification Search .............. 250/492.1, 250/492.21, 492.3, 423 R, 425, 310
See application file for complete search history.

(56) References Cited

U.S. PATENT DOCUMENTS

| | | | | |
|---|---|---|---|---|
| 4,367,429 A * | 1/1983 | Wang et al. | ............... | 313/362.1 |
| 5,525,806 A | 6/1996 | Iwasaki et al. | | |
| 5,986,264 A * | 11/1999 | Grunewald | .................. | 250/310 |
| 6,181,474 B1 * | 1/2001 | Ouderkirk et al. | ........... | 359/629 |
| 6,635,883 B2 * | 10/2003 | Torti et al. | .............. | 250/423 R |
| 7,071,475 B2 * | 7/2006 | Tomimatsu et al. | .... | 250/442.11 |
| 7,154,106 B2 * | 12/2006 | Oi et al. | .................... | 250/492.3 |
| 7,166,839 B2 * | 1/2007 | Tanaka et al. | ............... | 250/310 |
| 7,323,697 B2 * | 1/2008 | Kaga et al. | ............... | 250/491.1 |
| 2002/0079463 A1 * | 6/2002 | Shichi et al. | ............. | 250/492.1 |

(Continued)

FOREIGN PATENT DOCUMENTS

DE      3705361 A1    8/1988

(Continued)

OTHER PUBLICATIONS

Berg, S. et al. ("Synergistic sputtering effects during ion bombardment with two ion species" Journal of Vacuum Science & Technology, A: vacuum, Surfaces and Films (1995), 13 (3, Pt. 1), 831-3).*

(Continued)

*Primary Examiner*—Jack I Berman
*Assistant Examiner*—Brooke Purinton
(74) *Attorney, Agent, or Firm*—Patterson & Sheridan, LLP (57) ABSTRACT

An apparatus for in-situ specimen preparation is described. The apparatus includes an ion beam column 21 including at least: an liquid metal alloy ion source 56 including a first element for providing a light ion species with a mass of 10 g/mol to 60 g/mol and a second element for providing a heavy ions species with a mass of 150 g/mol or higher, a mass separator 58 for selectively separating the light ion species and the heavy ion species, and a focusing element for focusing the ion beam on a specimen. The apparatus further includes a specimen-beam-tilt unit for tilting the ion beam with respect to the specimen.

9 Claims, 4 Drawing Sheets

U.S. PATENT DOCUMENTS

2004/0251427 A1* 12/2004 Suzuki et al. ............ 250/491.1
2005/0161601 A1* 7/2005 Kochi et al. ................. 250/311
2007/0221843 A1* 9/2007 Ward et al. .............. 250/423 R

FOREIGN PATENT DOCUMENTS

| DE | 287354 | A5 | 2/1991 |
|---|---|---|---|
| EP | 1473560 | A1 * | 11/2004 |
| WO | 0198749 | A1 | 12/2001 |

OTHER PUBLICATIONS

Extended European Search Report dated Nov. 9, 2007.

* cited by examiner

METHOD AND APPARATUS FOR IN-SITU SAMPLE PREPARATION

FIELD OF THE INVENTION

The invention relates to an apparatus and method for in-situ sample preparation of a specimen and to an apparatus and a method for inspecting an in-situ prepared specimen by means of an electron beam. In particular, the invention relates to an ion beam device including means for conducting several sample preparation steps with one ion beam column. Specifically, it relates to an apparatus for in-situ specimen preparation and a method of preparing a cross-section of a specimen.

BACKGROUND OF THE INVENTION

For progress in microelectronics, it is important to have tools for inspecting microelectronical structures on a chip or wafer with ever increasing spatial resolution. At the same time, it is important to decrease the costs of such inspections in order for the industry to fabricate devices of ever increasing complexity at low costs.

Technologies such as microelectronics, micromechanics and biotechnology have created a high demand for structuring and probing specimens within the nanometer scale. Micrometer and nanometer scale process control, inspection or structuring, is often done with charged particle beams, e.g., probing or structuring is often performed with charged particle beams which are generated and focused in charged particle beam devices. Charged particle beams offer superior spatial resolution compared to photon beams, due to their short wave lengths at comparable particle energy.

Due to the progressing miniaturization of integrated circuits, it has become important to study, for example, the cross-section, the crystal structure and the layer structure of an integrated circuit structure below the surface of the wafer. This can done by inspecting a cross sectional thin slice (membrane) from the wafer or chip by means of a transmission electron microscope (TEM). Despite the progress in TEM sample preparation and TEM inspection, it is still complicated, expensive and time-consuming to carry out a TEM inspection because of the many steps needed for each measurement. For these reasons, inspections of cross sectional thin slices of a specimen, in particular the inspection of membranes of a wafer or chip, are expensive. Cross sectional inspections for a failure analysis of integrated circuits on a regular basis are therefore difficult.

Another prominent tool for inspections is the scanning electron microscope (SEM). The SEM uses a primary electron beam as a means to probe the surface structure of a given specimen. An interaction of the primary electron beam with the specimen causes electrons to be released into a backward direction with respect to the primary electron beam where they are detected by an electron detector. By scanning the primary electron beam across the specimen and determining the rate of the released electrons at each scan position, an image of the surface of the specimen with high spatial resolution is obtained. The spatial resolution of the image is essentially given by the size of the beam focus.

For inspections of cross sections, layer structures and crystal structures with an SEM, problems in light of a small material contrast and sample charging may occur. There are several methods for preparing a specimen to be able to provide cross-sectional images. These sample preparation methods are commonly conducted separately from the manufacturing processes of the specimen and are, thus, time consuming. Low voltage imaging for a reduction of specimen charging can generally not be simultaneously provided for all materials of a specimen.

SUMMARY

In light of the above, the an apparatus for in-situ specimen preparation according to independent claim 1 and a method of preparing a cross-section of a specimen with an ion beam device according to independent claim 11 are provided.

According to one embodiment an apparatus for in-situ specimen preparation is provided. The apparatus includes: a vacuum chamber for enclosing the specimen, and a ion beam device, wherein the ion beam device is connected to the vacuum chamber, the ion beam device includes: an liquid metal alloy ion source including a first element for providing a light ion species with a mass of 10 g/mol to 60 g/mol and a second element for providing a heavy ions species with a mass of 150 g/mol or higher, a mass separator for selectively separating the light ion species and the heavy ion species, and a focusing element for focusing the ion beam on a specimen. The apparatus includes further: a specimen-beam-tilt unit for tilting the ion beam with respect to the specimen, and an electron beam device, wherein the electron beam device is connected to the vacuum chamber.

According to another embodiment, a method of preparing a cross-section of a specimen with an ion beam device is provided. The method includes irradiating a specimen with an ion beam of a heavy ion species generated by the ion beam device under a first beam landing angle and irradiating the specimen with an ion beam of a light ion species generated by the ion beam device under a second beam landing angle, wherein the second beam landing angle is different from the first beam landing angle.

Further advantages, features, aspects and details of the invention are evident from the dependent claims, the description and the drawings.

Embodiments are also directed to apparatuses for carrying out the disclosed methods and including apparatus parts for performing each described method step. These method steps may be performed by way of hardware components, a computer programmed by appropriate software, by any combination of the two or in any other manner. Furthermore, embodiments are also directed to methods by which the described apparatus operates. They include method steps for carrying out every function of the apparatus.

BRIEF DESCRIPTION OF THE DRAWINGS

Some of the above indicated and other more detailed aspects of the invention will be described in the following description and partially illustrated with reference to the figures. Therein:

FIG. 1b shows a schematic view of another operational mode of the apparatus of FIG. 1a;

DETAILED DESCRIPTION OF THE INVENTION

Reference will now be made in detail to the various embodiments of the invention, one or more examples of which are illustrated in the figures. Each example is provided by way of explanation of the invention and is not meant as a limitation of the invention. For example, features illustrated or described as part of one embodiment can be used on or in conjunction with other embodiments to yield yet a further embodiment. It is intended that the present invention includes such modifications and variations.

Without limiting the scope of the present application, in the following it is referred to the detection of secondary electrons. The present invention can still be applied for apparatuses and components detecting secondary and/or backscattered particles in the form of electrons or ions, photons, X-rays or other corpuscles in order to obtain a specimen image. Generally, when referring to corpuscles it is to be understood as a light signal, in which the corpuscles are photons, as well as particles, in which the corpuscles are ions, atoms, electrons or other particles.

Within the following description of the drawings, the same reference numbers refer to the same components. Generally, only the differences with respect to the individual embodiments are described.

A "specimen" as referred to herein, includes, but is not limited to, semiconductor wafers, semiconductor workpieces, and other samples or workpieces such as memory disks and the like. Embodiments of the invention may be applied to any workpiece on which material is deposited or which is structured. A specimen includes a surface to be structured or on which layers are deposited.

Generally, the apparatus 10 according to the invention is meant to be used for the preparation of a specimen 14. The specimen 14 can be a solid substrate like, e.g., a semiconductor wafer or chip. For such specimen, the inspection of the wafer 14 with an electron beam device results in an image of the surface of a wafer (SEM mode), e.g., to locate a defect on the structured surface of the wafer. In order to provide information in additional to a surface image, a SEM mode image can be provided for a cross-section prepared specimen. Thereby, an in-situ sample preparation is provided in the apparatus 10. The apparatus 10 can be integrated in an integrated circuit production line.

Figure 5:
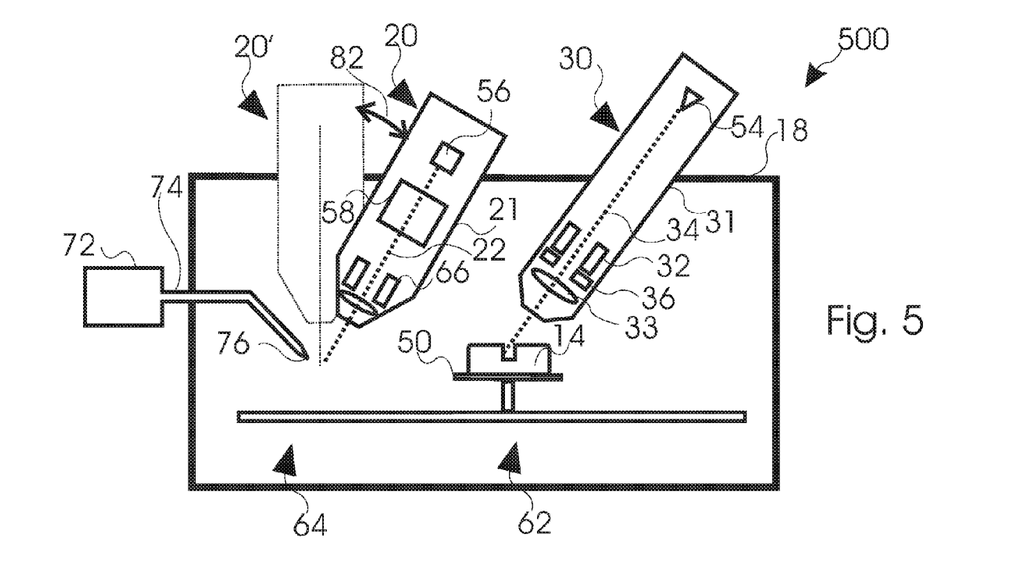
FIG. 5 shows a schematic view of an apparatus for preparing a cross-section of a specimen with an ion beam device and a inspecting device according to embodiments described herein.
Figure 6:
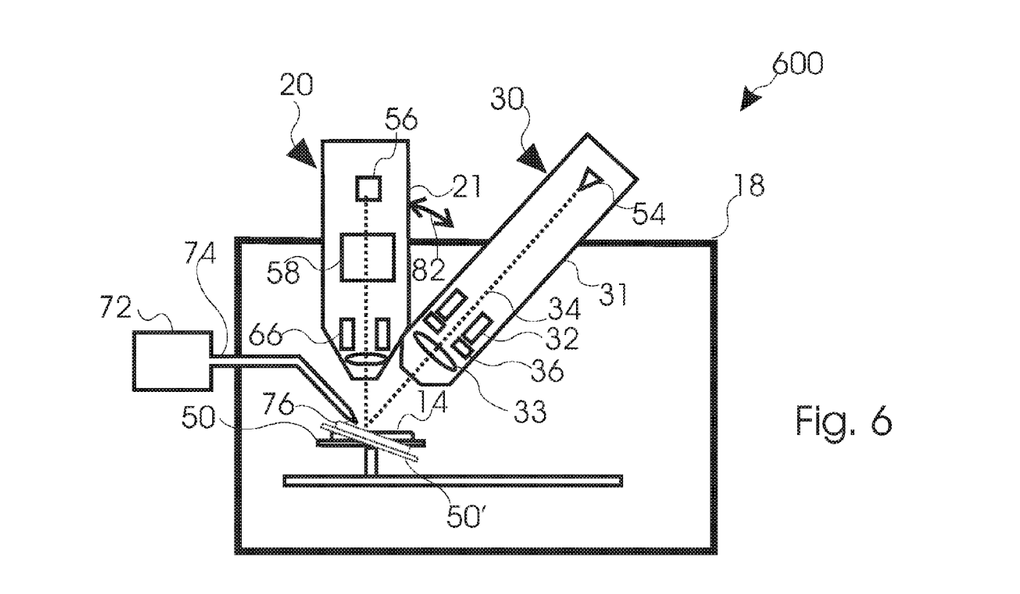
FIG. 6 shows a schematic view of an apparatus for preparing a cross-section of a specimen with an ion beam device and a connected inspecting device according to embodiments described herein.

According to one embodiment, an in-situ specimen apparatus can include an ion beam device for sample preparation as one tool and an electron beam device in a separate tool. According to another embodiment, as shown in FIGS. 5 and 6 an ion beam device 20 and an electron beam device 30 can be integrated in one tool.

Figure 1A:
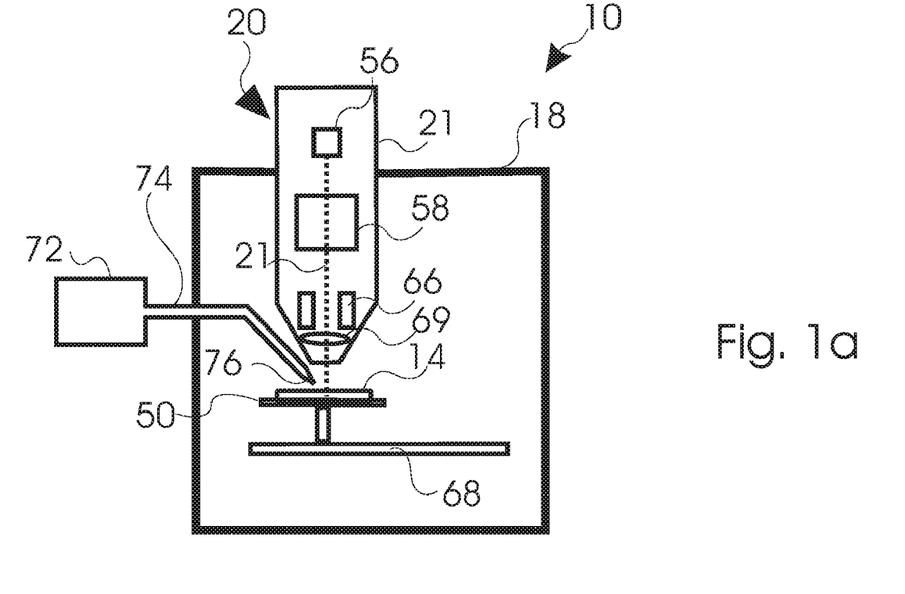
FIG. 1a shows a schematic view of an apparatus for preparing a cross-section of a specimen with an ion beam device according to embodiments described herein.

Within FIG. 1a an ion beam device 20 is shown. The ion beam device 20 is used to generate an ion beam 22 for preparation of a cross-section specimen and for etching the specimen 14. According to one embodiment, the ion beam device includes an ion beam source 56. The ion beam source emits an ion beam along an optical axis. A condenser lens (not shown) can be used to collimate the ion beam.

Figure 1B:
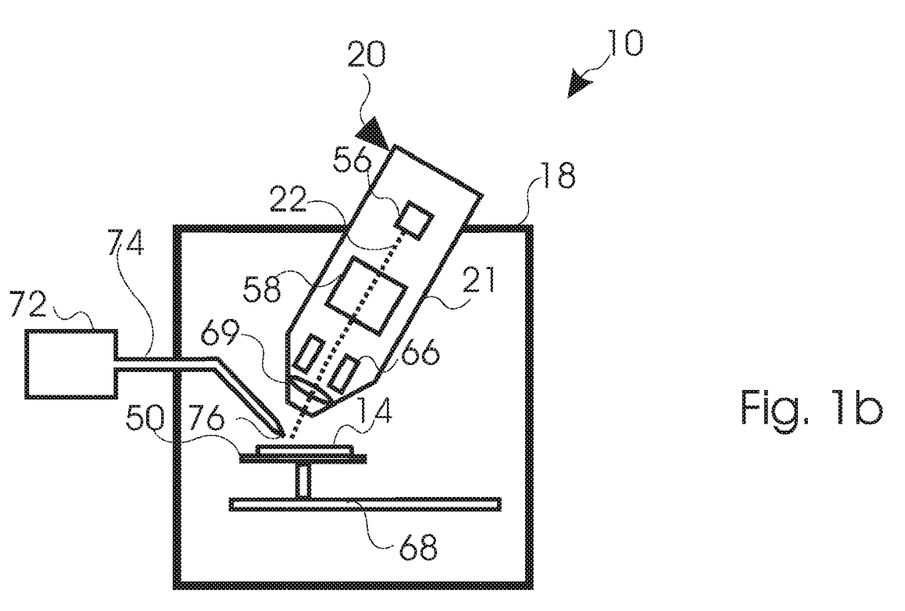

Within FIGS. 1a and 1b, an ion beam, which originates from the ion beam source 56, is shown to enter a mass separator 58. Within the mass separator ions having masses different from the predetermined mass are deflected away from the desired beam path and, for example, blocked thereafter. The selected ion beam, which includes ions having a predetermined mass or a predetermined range of masses, passes through the column, is guided on a specimen and can be focused by an objective lens 69 on specimen 14.

According to one embodiment, the ion source 56 is a liquid metal alloy ion source (LMAIS). Therein, for example a metal alloy is provided on a tungsten hairpin or another wire, which can be heated. According to a further embodiment the metal alloy can be the binary alloy, such as SiPr, SiAu or a combination of silicon and another metal c. Yet according to other embodiments AuSiMn, AuSiGe can be used. Typically, the metal is a heavy metal with a mass of 100 g/mol the or higher. As another example, Mn may be combined with a heavy metal or with another metal, e.g., as AuSiMn, or GaMn. A further example can be CoNd.

According to another embodiment, the metal alloy is eutectic. Thereby, the melting temperature of the alloy is reduced as compared to the melting point of the individual elements.

According to one embodiment, an emitter for an ion source is provided, wherein said emitter includes the binary alloy PrSi as a source material. Thus, only Pr and Si ions as well as a small amount of cluster and molecular ions are generated by the ion source according to this aspect of the present invention. Accordingly, no impurities will be introduced into semiconductor materials when being processed with an ion beam generated by this ion source. Furthermore, Pr ions are much heavier than Si ions. Accordingly, when structuring semiconductor surfaces Pr can be used for quick surface degradation whereas the lighter Si ions can be used for fine degradation or inspection. Thus, the binary alloy PrSi allows for fast and fine surface degradation, fine specimen modification, as well as inspection with a single ion source. Finally, in contrast to pure Pr, binary alloy PrSi is sufficiently stable when exposed to air so that the PrSi ion source can be readily manufactured and mounted.

Generally, if a liquid metal alloy ion source is used according to embodiments herein, ions with a high mass can be emitted for high milling rates as compared to, for example, gallium sources. Further, ions with significantly different masses can be generated. Thereby, it is possible to provide different modes of operation. According to some embodiments, the difference in mass of the generated ions is, for example, at least 5 g/mol, 10 g/mol, 50 g/mol, 100 g/mol or higher. For one operational mode, a heavy ion species can be selected and for another operational mode a light ion species can be selected.

For the embodiments described herein, it is typical that electrostatic lenses can be used for collimating, shaping or focusing of the ion beam. The electrostatic lenses can be applied as Einzel lenses, as accelerating lenses, or decelerating lenses. Alternatively or additionally, it may be possible to provide some magnetic focusing elements. However, high magnetic fields may be required.

Figure 2:
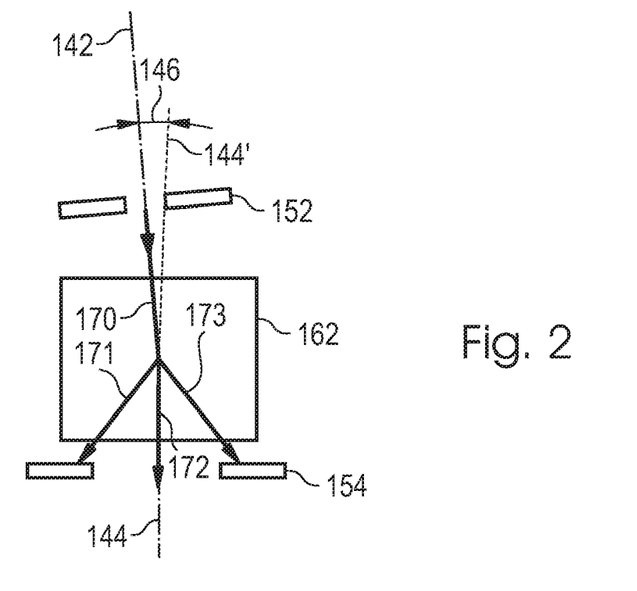
FIG. 2 shows a schematic view explaining a mass separator according to embodiments described herein.

A mass separator 58 can be provided in the form of a Wien filter, two Wien filters, or other ExB filters. According to one embodiment, a mass separator can be provided as explained with respect to FIG. 2. FIG. 2 shows an achromatic mass separator. An aperture 152 in the form of a diaphragm that might have a circular, slit-shaped, rectangular, or another desired shape is used to provide a numerical aperture of the ion beam system. The ion beam 170, which originates from the ion beam source, is shown to enter the achromatic deflection unit 162. Within the achromatic deflection unit, ions having masses different from the predetermined mass are deflected away from the second optical axis 144 as indicated by ion beams 171 and 173. Thereby, ion beams 171 and ion beams 173 illustrate ion beams consisting of ions having a mass smaller than the predetermined mass or higher than that predetermined mass, respectively. The selected ion beam 172, which includes ions having a predetermined mass or a predetermined range of masses, passes through the mass separation aperture 154.

Within the achromatic deflection unit 162 substantially perpendicular static electric and magnetic fields normal to the z-axis (optical axis) are used. The force acting on the ions is given by the coulomb force $$F_e = q \cdot E \quad (1)$$

and the Lorentz force $$F_m = q \cdot (v \times B) \quad (2)$$

The angle of deflection of the ions in the electric and magnetic fields, both of length l, can be described with the following equation:

$$\theta = q l (vB - E)/(mv^2) \quad (3)$$

If the ion beam path 170 is slightly inclined with respect to the axis 144 when the ions enter the achromatic deflector, the ions are deflected within the achromatic deflector to travel essentially along axis 144 after trespassing the achromatic deflector. This can be understood in light of the derivative of equation 3, that is $$d\theta/dv = -(ql/mv^2)(1 - 2E/vB) \quad (4)$$

The deflection angle is independent of the velocity of the ions if the condition that the magnetic force equals twice the electric force is fulfilled.

In embodiments described herein, the achromatic deflector 162 can be described at least by one of the following features. According to one embodiment, the achromatic deflection unit has an inductance of 0.05 µH to 2 µH, or, e.g., 0.1 to 2.0 µH. For a deflection a relatively high magnetic induction may be applied in order to deflect heavy ions of, e.g., a LMAIS. As a result, the magnetic field can be 0.02 T to 0.5 T. A corresponding electric field can be 4 V/mm to 75 V/mm. The magnetic flux density of 0.02 T to 0.5 T can be generated by an electromagnet, a permanent magnet, a combination of a permanent magnet and electromagnet or some other magnetic device. In light of the above, according to a further embodiment, which may be combined with the other embodiments described herein, 75 to 500 ampere turns or even a few thousand ampere turns may be provided. According to an even further embodiment, about 10 to 400 coil windings can be provided. Yet according to another embodiment, 50 to 500 coil windings can be provided. Nevertheless, it might be possible to provide even more coil windings, for example, up to a few thousand. According to an even further embodiment, the achromatic deflection angle can be between 0.3° and 7°. According to another further embodiment, the deflection angle is between 1° and 3°. The achromatic deflection angle is illustrated as angle 146 in FIG. 2.

According to further embodiments, the electric and magnetic dipole fields and/or the components generating the electric and magnetic dipole fields may be separated from each other, that is, they do not overlap along the direction of the optical axis. Thereby, a corresponding system can typically be arranged with short deflection regions along the optical axis.

More detailed embodiments regarding the achromatic mass separator are described in commonly assigned application, which has been filed on the same day and which is herewith incorporated by reference in its entirety.

FIG. 1b shows the apparatus 10, wherein the ion beam device is tilted with respect to the specimen 14. The tilted angle between the ion beam and the specimen can, particularly in combination with the light ion species generated by the ions source 56, be used for a further operation mode. According to one embodiment, it is, thereby, possible to tilt the ion beam device. According to another embodiment, it is possible to position the specimen 14 on a tiltable specimen holder 50. According to an even further embodiment, it might also be possible to tilt the ion beam by deflection units for the ion beam. According to further embodiments, the above described options for tilting the ion beam and the specimen with respect to each other might also be combined.

According to embodiments described herein, the ion beam device 20 can provide several modes of operation. Thereby, a fast and process compatible in-situ sample preparation of cross-sections can be realized. As shown in FIGS. 1a and 1b, according to one embodiment, a ion beam device 20 can be provided, whereby an ion source, for example a LMAIS, provides ions with a high mass and ions with a low mass. For example, Si ions can be provided as ions with a low mass and ions having a significantly higher mass can be provided as ions with a high mass. The mass separator 58 enables a switching between the different ion species.

Figure 3:
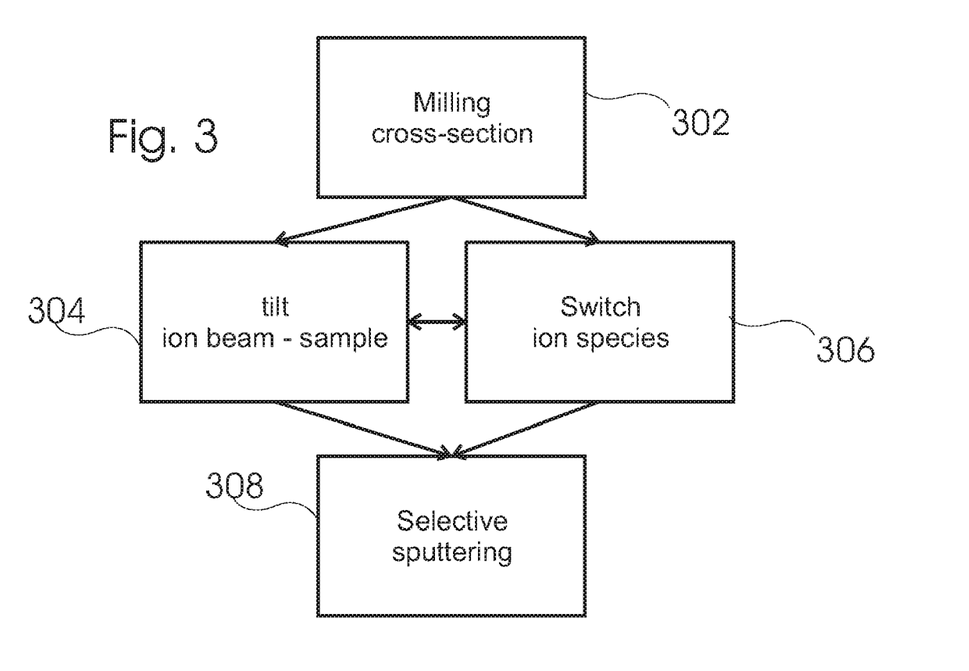
FIG. 3 shows a flow diagram illustrating a method of preparing a cross-section of a specimen with an ion beam device according to embodiments described herein.
Figure 4:
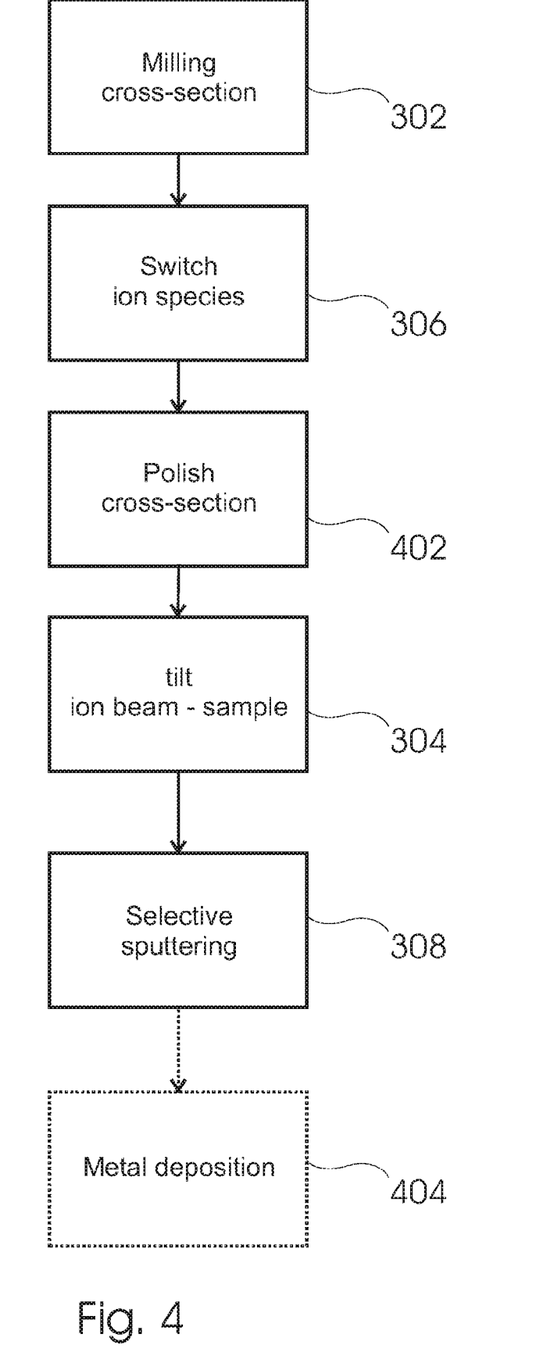
FIG. 4 shows a flow diagram illustrating a further method of preparing a cross-section of a specimen with an ion beam device according to embodiments described herein.

Embodiments for an in-situ sample preparation can be described with respect to FIGS. 3 and 4. According thereto, as shown in FIG. 1a, the ion beam device can be used under normal incidence with a heavy ion species. A focused ion beam including heavy species and, according to an even further embodiment, twice charged species, can be utilized for milling the specimen (step 302). Thereby, a cross section can be generated within the specimen 14. This can, e.g., be done by laying open a hole or trench in the specimen, wherein the hole or trench is sufficiently large to be able to inspect a cross-section of the specimen.

It is to be understood that an ion beam tilt can be used in step 302 to provide a predetermined milling angle of the ion beam. However, a beam tilt is not mandatory for the milling step.

After the milling step, the specimen and the ion beam are positioned in a tilted arrangement (step 304) with respect to each other. This can be done by tilting the ion beam device, the sample or the ion beam. According to one further embodiment, the beam tilt can be in range of 30° to 60°. According to an even further embodiment, the beam tilt can be about 45°. Further, within step 306, the light ion species can be selected. Steps 304 and 306 are depicted next to each other as there is no specific order defined and the steps can also be simultaneously conducted. Thereafter, a selective sputtering can be applied to the cross-section in step 308.

The selective sputtering with the light species ion beam under a tilted ion beam incidence can, according to one embodiment, be conducted by scanning the ion beam over the specimen by means of scanning unit 66. Thereby, it is possible to use a focused ion beam. According to a further embodiment, a defocused ion beam can be applied for the sputtering. The sputtering with the light ion species etches the cross-section material selectively. The light ion species have, on the one hand, nearly no sputtering effect on materials with high mass elements. On the other hand, materials with light elements are sputtered by the light ion species. Thereby, light elements can typically be understood as having mass similar to the light ion species or lighter, depending on the angle of incidence.

As a result, the cross-section, which has been generated in step 302, is selectively etched in step 308. Thus, the topographical contrast of the cross-section is increased. An inspection with electron beam device 30 can, thereby, be improved.

As described above step 304 is conducted under a first beam landing angle with a heavy ion species and step 308 is conducted under a second beam landing angel with a light on species. Thereby, a controller can be provided in a corresponding apparatus that is adapted to control a switching of the ion species and the beam landing angle.

A further embodiment for preparing a specimen to obtain a cross-sectional view is shown in FIG. 4. A focused ion beam including heavy species and, according to an even further embodiment, twice charged species, can be utilized for milling the specimen (step 302). Typically, the milling step includes milling under normal beam incidence. Thereby, a cross section can be generated within the specimen 14. This can, e.g., be done by laying open a hole or trench in the specimen, wherein the hole or trench is sufficiently large to be able to inspect a cross-section of the specimen. It has to be noted that the milling step can, according to yet another embodiments, be conducted under non-normal beam incidence or under varying beam incidence angles.

Further, within step 306, the light ion species can be selected. The light ion species is scanned over the generated cross-section area of the specimen under substantially normal beam incidence. According to one embodiment Si can be used as an ion species. According to another embodiment, the ion beam of the light ion species is focused and raster scanned over the specimen. The light ion species polishes (step 402) the area generated by the milling procedure of the heavy ion beam.

Thereafter, the specimen and the ion beam can be tilted (step 304) with respect to each other by tilting the ion beam device, the sample or the ion beam. According to one further embodiment, the beam tilt can be in range of 30° to 60°. According to an even further embodiment, the beam tilt can be about 45°. Thereafter, a selective sputtering can be applied to the cross-section in step 308.

The selective sputtering with the light species ion beam under a tilted ion beam incidence can, according to one embodiment, be conducted by scanning the ion beam over the specimen by means of scanning unit 66. Thereby, it is possible to use a focused ion beam. According to a further embodiment, a defocused ion beam can be applied for the sputtering. The sputtering with the light ion species etches the cross-section material selectively. The light ion species have, on the one hand, nearly no sputtering effect on materials with high mass elements. On the other hand, materials with light elements are sputtered by the light ion species. Thereby, light elements can typically be understood as having mass similar to the light ion species or lighter, depending on the angle of incidence.

As a result, the cross-section, which has been generated in step 302, is polished in step 402 and is selectively etched in step 308. Thus, the topographical contrast of the cross-section is increased. An inspection with electron beam device 30 can, thereby, be improved.

An even further embodiment for preparing a specimen to obtain a cross-sectional view is also shown in FIG. 4. After sputtering the specimen with the light ion species to etch the cross-section material selectively (step 309), a further step of metal deposition on the cross-sectional area can be added. For example, FIGS. 1a and 1b show a gas supply unit including a gas tank 72, a gas conduit 74 and a nozzle 76. The nozzle is directed towards the position at which the ion beam impinges on a specimen. With the gas supply unit a metal organic gas or another gas suitable for metal film deposition is provided towards to the specimen. On incidence of the ion beam, as an example, the light ion beam, the metal organic gas is excited by the ion beam. Thereby, a metal film is provided on the specimen. Generally, for the metal deposition step, the light ion beam can advantageously be used since a sputtering effect of the specimen to be coated can be reduced. Further, for the use of Si as a light element can be considered advantageous over other elements for a plurality of steps of embodiments described herein, particularly if Si-semiconductor products are considered. By using Si as an ion beam no different material is introduced in the Si-based semiconductor. However, it should be noted that this might also apply for other elements and other material systems (See, e.g., Ge for Ge-Wafers). On the other hand, when glass substrates are considered Si, might again be one light element to be used for polishing, material selective etching, metal deposition, and the like.

Such a metal film, which is provided on the topography enhanced cross-sectional area reduces the charging of the specimen. In particular, different amounts of charging, which may occur for different materials included in the specimen, can be avoided by providing the metal film on the selectively etched cross-section. Typical metal films include materials of noble metals, which have a good conductivity and which do not effect the process or the specimen adversely. For example, the metal containing gas can include platinum or tungsten, such that a respective metal layer of a view nm thickness (e.g., 1-10 nm) is deposited on the specimen.

According to one embodiment, the metal deposition can be conducted by inserting the metal containing gas and by scanning the light focused ion beam over the area, on which the metal film is to be deposited. According to another embodiment also a defocused ion beam can be used together with metal containing gas.

Within FIG. 5 an apparatus 500 for specimen preparation and specimen inspection is shown. The specimen 14 can be a solid substrate like, e.g., a semiconductor wafer or chip. For such specimen, the inspection of the wafer 14 with an electron beam device 30 using the first detector 36 results in an image of the surface of the wafer 14 (SEM mode), e.g., to locate a defect on the structured surface of the wafer. In order to provide information in addition to a surface image, a SEM mode image can be provided for a cross-section prepared specimen. Thereby, an in-situ sample preparation is provided in the apparatus. The apparatus 500 can be integrated in an integrated circuit production line.

The vacuum chamber shown as an example in FIG. 5 is intended to provide a continuous vacuum during the irradiation of the wafer 14 by means of the electron beam device 30 (SEM mode), during the preparation of the specimen 14 by means of the ion beam device 20 (FIB mode). According to one embodiment, the vacuum is maintained during the entire time of sample preparation and inspections of the specimen. In this case, the inspection the specimen 14 can carried out without having to be in contact with the external environment. This can improve the reliability of the measurements.

Typically, the vacuum chamber is made to provide a vacuum in the region of the specimen which is better than 10-3 mbar, preferably better than 10-5 mbar. The better the vacuum, the better the imaging performance of the electron beam device 30 and the less the pollution of the specimen 14. Further, preferably, the vacuum chamber is connected with the ion beam device 20 and/or electron beam device 30 in order to provide a hermetic vacuum for the electron beam 34 and the ion beam 22 on their way from their respective beam sources to the common vacuum chamber 18.

The common vacuum chamber 18 makes it possible that the apparatus can be operated in the SEM mode and the FIB mode without ever having to break the vacuum when switching from one mode to the other. This way, the specimen 14 is never exposed to environmental pollution during the inspection procedure.

Within FIG. 5 an ion beam device 20 is shown. The ion beam device 20 is used to generate an ion beam 22 for preparation of a cross-section specimen and for etching the specimen 14. According to one embodiment, the ion beam device includes an ion beam source 56. The ion beam source emits an ion beam along an optical axis. A condenser lens (not shown) can be used to collimate the ion beam.

Within FIG. 1, an ion beam, which originates from the ion beam source 56, is shown to enter a mass separator 58. Within the mass separator ions having masses different from the predetermined mass are deflected away from the desired beam path. The selected ion beam, which includes ions having a predetermined mass or a predetermined range of masses, passes through the column and may be focused by an objective lens on specimen 14.

According to one embodiment, the ion source 56 is a liquid metal alloy ion source (LMAIS). Therein, for example a metal alloy is provided on a tungsten hairpin or another wire, which can be heated. According to a further embodiment the metal alloy can be the binary alloy, such as SiPr, SiAu or a combination of silicon and another metal c. Yet according to other embodiments AuSiMn, AuSiGe can be used. Typically, the metal is a heavy metal with a mass of 100 g/mol the or higher. As another example, Mn may be combined with a heavy metal or with another metal, e.g., as AuSiMn, or GaMn. A further example can be CoNd.

According to another embodiment, the metal alloy is eutectic. Thereby, the melting temperature of the alloy is reduced as compared to the melting point of the individual elements.

According to one embodiment, an emitter for an ion source is provided, wherein said emitter includes the binary alloy PrSi as a source material. Thus, only Pr and Si ions as well as a small amount of cluster and molecular ions are generated by the ion source according to this aspect of the present invention. Accordingly, no impurities will be introduced into semiconductor materials when being processed with an ion beam generated by this ion source. Furthermore, Pr ions are much heavier than Si ions. Accordingly, when structuring semiconductor surfaces Pr can be used for quick surface degradation whereas the lighter Si ions can be used for fine degradation or inspection. Thus, the binary alloy PrSi allows for fast and fine surface degradation as well as inspection with a single ion source. Finally, in contrast to pure Pr binary alloy PrSi is sufficiently stable when exposed to air so that the PrSi ion source can be readily manufactured and mounted.

Generally, if a liquid metal alloy ion source is used according to embodiments herein, ions with a high mass can be emitted for high milling rates as compared to, for example, gallium sources. Further, ions with significantly different masses can be generated. Thereby, it is possible to provide different modes of operation. According to some embodiments, the difference in mass of the generated ions is, for example, at least 5 g/mol, 10 g/mol, 50 g/mol, 100 g/mol or higher. For one operational mode, a heavy ion species can be selected and for another operational mode a light ion species can be selected.

For the embodiments described herein, it is typical that electrostatic lenses can be used for collimating, shaping or focusing of the ion beam. The electrostatic lenses can be applied as Einzel lenses, as accelerating lenses, or decelerating lenses. Alternatively or additionally, it may be possible to provide some magnetic focusing elements. However, high magnetic fields may be required.

Within FIG. 5, the ion beam device is shown in a tilted state. As indicated by the dotted line showing ion beam device 20' in a not-tilted status and as indicated by the arrow 82, the ion beam device and the specimen plane can be tilted with respect to each other in order to provide the options of milling a cross-section and sputtering the cross-section area material selectively. As described with respect to FIGS. 1a and 1b, the varying beam landing angle of the ion beam can be achieved by tilting the ion beam device 20, by tilting the specimen holder 50 and, thus, the specimen, by tilting the ion beam with an deflector arrangement, or by a combination therefrom.

The prepared cross-section, which has been selectively etched by a tilted light ion beam, can then be inspected with electron beam device 30 in the form of an SEM. This is shown in FIG. 5. Therein the specimen height is shown exaggerated to be able to show the inspection of the cross-section area of the specimen. Further, a stage 68 is shown on whose surface the specimen holder 50 can be moved from the inspection position 62 to the etching position 64 and vice versa.

According to one embodiment, as shown in 5 and 6, the electron beam device 30 can be connected to the same tool or the same chamber as the FIB preparation tool 20. The electron beam device 30 includes at least one electron beam source 54 to generate an electron beam 34. The electron beam source 54 may, for example, be any of the electron beam sources usually used for electron microscopes, e.g., a thermionic tungsten hairpin gun, or one of the many types of field emission electron guns known in the art. The electron beam device 30 further includes beam optical components to focus the electron beam onto the specimen 14 in order to increase the spatial resolution, at least one anode to accelerate the electrons of the electron beam 34 to a predetermined energy and/or to define the landing energy on the specimen. For typical SEM applications on a silicon wafer, the landing energy is in the range of 100 eV to 30 keV. The spot size of the SEM can be as small as about down to 1 nm. In view of the increased topographical contrast after selective etching, a desired cross-section image can be obtained. The electron beam device 30 further includes a scanning unit 32 for scanning the electron beam 34 across the specimen 14. This way, the electron beam device 30 can inspect the surface of the specimen using the detector 36 to detect the electrons 38 that are released from the specimen 14 in a backward direction with respect to the direction of the electron beam 34. The detector 36 may be enclosed within the electron beam column 31 as shown in the FIGS. 1a and 1b; however it is also possible to position the detector 36 outside of the emitter beam column 31, e.g., at the side of the electron beam column 31 for backward electrons 38 detection. The size and design of the detector 36 depends on the design of the electron beam device 30, in particular on the available space and the electric field distribution in the electron beam region. In the FIGS. 5 and 6, the detector 36 surrounds the electron beam axis with a circular symmetry in order to detect backwards directed electrons 38 which have entered the electron beam device 30 through the focusing lens 33. Preferably, the detector 36 is a non-imaging detector, e.g., in the form of semiconductor detector or a scintillation-photomultiplier detector (Everhart-Thomley detector). Both detectors are preferably capable of detecting secondary electrons having an energy of typically 0 to 50 eV, and backscattered electrons having an energy up to the full primary electron beam energy.

According to another embodiment, as shown in FIGS. 1a and 1b, it is also possible that the electron beam device is not included in the tool for preparation of the cross-section or is not connected to the vacuum chamber 18, but instead is provided in a separate tool.

According to further embodiments, the electron beam device 30 may include a tilting mechanism in order to inspect the specimen 14 under different landing angles. Similarly, it is also possible for the ion beam device 30 to have a tilting mechanism in order to etch the specimen at different angles. A tiltable ion beam device 20 provides the option to generate a cross-section within the specimen and to etch the cross-section material selectively. In addition, or alternatively, the ion beam device 30 can be provided with beam optical components, e.g., a beam deflector or a beam shifter, to provide the ion beam 22, which can be scanned across the specimen, 14 at various angles to obtain a desired sample 12 from the specimen 14.

One embodiment including a tiltable specimen holder 50 is described with respect to FIG. 6. Therein, on the one hand, the ion beam device 20 is indicated to be tiltable by arrow 82. On the other hand, a tiltable specimen holder 50' is indicated by the dashed lines. These options may be used independently or in combination. It is understood that the tilted electron beam 30 and a tilted ion beam 20 does not necessarily conflict as they can be tilted in different planes.

The apparatus 600 shown in FIG. 6 is similar to the apparatus 500 shown in FIG. 1. However, the ion beam device 20 and the electron beam device are arranged with respect to each other, such that the electron beam and the ion beam can be positioned at the same specimen position without moving the specimen. The apparatus 600 of FIG. 6 is the same as the apparatus 500 of FIG. 5, with the difference that the FIB 20 and the electron beam device 30 are tilted with respect to each other. The tilting angle of the SEM 30 and the FIB 20 are such that the ion beam 22 and the electron beam 34 can be directed onto the same region on the specimen 14. This way, it is, for example, possible to inspect the specimen 14 during the specimen preparation by means of the FIB 20, i.e., SEM mode and FIB mode can be carried out at the same time. In this case, it is not necessary to move the specimen holder 50 to the FIB after inspection in the SEM mode. Further, the area of specimen preparation can easily be addressed with the electron beam.

This feature of inspecting the specimen during etching of the cross-section can, according to a further embodiment also be realized by providing the ion beam device 20 with a detector similar to one of the embodiments of the detector 36 described above. The light ion species beam can then be used for generating backscattered or backscattered secondary particles or corpuscles. If the energy of the light ion beam is reduced sufficiently, no specimen modification or negligible specimen modification can be realized. Thereby, a raster scanning of the light ion beam can be used to inspect the beam during etching.

The embodiments described above with regard to FIG. 6 can be further modified such that in combination with any of the other embodiments described above, particularly with reference to FIG. 5, additional further embodiments can be yielded.

The invention claimed is:

1. An apparatus for in-situ specimen preparation, comprising:
    a vacuum chamber for enclosing a specimen; and
    an ion beam device, wherein the ion beam device is connected to the vacuum chamber, the ion beam device comprising:
        a liquid metal alloy ion source including a first element for providing a light ion species with a mass of 10 g/mol to 60 g/mol and a second element for providing a heavy ion species with a mass of 150 g/mol or higher;
        a mass separator for selectively separating an ion beam into a first beam comprising the light ion species and a second beam comprising the heavy ion specie; and
        a focusing element for focusing either the first beam or the second beam on the specimen;
    a specimen-beam-tilt unit for tilting the first beam or the second beam with respect to the specimen; and
    an electron beam device, wherein the electron beam device is connected to the vacuum chamber.

2. The apparatus according to claim 1, wherein the first element is Si.

3. The apparatus according to claim 1, further comprising:
    a gas injection unit for supplying a gas to a place of incidence of the ion beam on the specimen.

4. The apparatus according to claim 3, wherein the gas injection unit includes a gas tank and at least one nozzle directed to the place of incidence of the ion beam.

5. The apparatus according to claim 1, wherein the mass separator is an achromatic mass separator and the apparatus is a non-straight vision system.

6. The apparatus according to claim 1, wherein the specimen-beam-tilt unit includes a mechanism for tilting the ion beam device.

7. The apparatus according to claim 1, wherein the specimen-beam-tilt unit includes a mechanism for tilting the specimen.

8. The apparatus according to claim 1, wherein the specimen-beam-tilt unit includes a deflection unit for electrically tilting the ion beam.

9. The apparatus according to claim 1, wherein the electron beam device and the specimen are positioned and oriented with respect to each other to provide a tilted electron beam on the specimen.

* * * * *

UNITED STATES PATENT AND TRADEMARK OFFICE
CERTIFICATE OF CORRECTION

| | |
|---|---|
| PATENT NO. | : 7,829,870 B2 |
| APPLICATION NO. | : 11/925595 |
| DATED | : November 9, 2010 |
| INVENTOR(S) | : Frosien |

It is certified that error appears in the above-identified patent and that said Letters Patent is hereby corrected as shown below:

In the Detailed Description of the Invention:

Column 10, Line 66, please delete "(Everhart-Thomley detector)" and insert --(Everhart-Thornley detector)-- therefor.

Signed and Sealed this
Eighth Day of February, 2011

David J. Kappos
*Director of the United States Patent and Trademark Office*